(12) United States Patent  (10) Patent No.: US 8,216,977 B2
Harrington et al.  (45) Date of Patent: Jul. 10, 2012

(54) HIGH TEMPERATURE SUPERCONDUCTORS

(75) Inventors: Sophie-Ann Harrington, Cambridge (GB); Judith Macmanus-Driscoll, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 13/057,449

(22) PCT Filed: Aug. 5, 2009

(86) PCT No.: PCT/GB2009/001919
§ 371 (c)(1),
(2), (4) Date: Feb. 3, 2011

(87) PCT Pub. No.: WO2010/015817
PCT Pub. Date: Feb. 11, 2010

(65) Prior Publication Data
US 2011/0136670 A1  Jun. 9, 2011

Related U.S. Application Data

(60) Provisional application No. 61/086,841, filed on Aug. 7, 2008.

(51) Int. Cl.
*H01L 39/12* (2006.01)
(52) U.S. Cl. ...................................................... 505/125
(58) Field of Classification Search .................. 505/125, 505/779, 780; 501/134, 152
See application file for complete search history.

(56) References Cited

U.S. PATENT DOCUMENTS

| 7,026,271 | B1* | 4/2006 | Weinstein | 505/125 |
| 2006/0025310 | A1* | 2/2006 | Driscoll et al. | 505/100 |
| 2011/0045984 | A1* | 2/2011 | Holesinger et al. | 505/100 |
| 2012/0035056 | A1* | 2/2012 | Aytug et al. | 505/150 |

OTHER PUBLICATIONS

Y. Yoshida, K. Matsumoto, Y. Ichino, "High-critical-current-density expitaxial films of SmBa2Cu3O7-x in high fields," Japanese Journal of Applied Physics Part 2-Letters & Express Letters 44 (1-7), L129-L132 (2005) (Cited in priority U.S. Appl. No. 61/086,841).

S. R. Foltyn, H. Wang, L. Civale, "Overcoming the barrier to 1000 A/cm width superconducting coatings," Applied Physics Letters 87 (16) (2005) (Cited in priority U.S. Appl. No. 61/086,841).

V. F. Solovyov, H. J. Wiesmann, L. Wu, "High critical currents by isotropic magnetic-flux-pinning centres in a 3 μm-thick YBa2Cu3O7 superconducting coated conductor," Superconductor Science & Technology 20 (4), L20-L23 (2007) (Cited in priority U.S. Appl. No. 61/086,841).

R. Feenstra, A. A. Gapud, F. A. List, "Critical currents I-c (77k) > 350 A/cm-width achieved in ex situ YBCO coated conductors using a faster conversion process," IEEE Transactions on Applied Superconductivity 15(2), 2803-2807 (2005) (Cited in priority U.S. Appl. No. 61/086,841).

(Continued)

*Primary Examiner* — Colleen Dunn
(74) *Attorney, Agent, or Firm* — Leason Ellis LLP

(57) ABSTRACT

Compositions are disclosed of a matrix of a high temperature superconductive oxide such as YBCO, with non-superconductive particles distributed in the matrix. The non-superconductive particles comprise at least one rare earth element (RE) and at least one of tantalum (Ta) and niobium (Nb). Of particular interest are non-superconductive particles of composition RE-Ta$_3$O$_7$ (RTO), where RE is Yb, Er, Gd or Sm, disposed in a YBCO superconductive matrix.

25 Claims, 9 Drawing Sheets

OTHER PUBLICATIONS

X. Wang, A. Dibos, and J. Z. Wu, "Weakening thickness dependence of critical current density in YBaCu3O7-x films using nanotube pore insertion," Physical Review B 77 (14) (2008) (Cited in priority U.S. Appl. No. 61/086,841).

P. Mele, K. Matsumoto, T. Horide, "Incorporation of double artificial pinning centers in YBa2Cu3O7-d films," Superconductor Science & Technology 21 (1) (2008) (Cited in priority U.S. Appl. No. 61/086,841).

J. Hanisch, C. Cai, R. Huhne, "Formation of nanosized BaIrO3 precipitates and their contribution to flux pinning in Ir-doped YBa2Cu3O7-delta quasi-multilayers," Applied Physics Letters 86 (12) (2005) (Cited in priority U.S. Appl. No. 61/086,841).

V. Galluzzi, A. Augieri, L. Ciontea, "YBa2Cu3O7-delta films with BaZrO3 inclusions for strong-pinning in superconducting films on single crystal substrate," IEEE Transactions on Applied Superconductivity 17 (2), 3628-3631 (2007) (Cited in priority U.S. Appl. No. 61/086,841).

H. Kobayashi, Y. Yamada, A. Ibi, "Investigation of in-field properties of YBCO multi-layer film on PLD/IBAD metal substrate," Physica C-Superconductivity and its Applications 463, 661-664 (2007) (Cited in priority U.S. Appl. No. 61/086,841).

M. Yoshimura, Y. Yokogawa, and S. Somiya, "Solidification Points for the Fluorite-Related Phases of R3TaO7 (R=Rare-Earth)," Journal of Materials Science Letters 5 (10), 1022-1024 (1986) (Cited in priority U.S. Appl. No. 61/086,841).

G. W. Kammlott, T. H. Tiefel, and S. Jin, "Recovery of 90K Superconductivity in Transition-Metal-Doped Y-Ba-Cu-O", Applied Physics Letters 56 (24), 2459-2461 (1990) (Cited in priority U.S. Appl. No. 61/086,841).

D. A. Fletcher, R. F. McMeeking, D. Parkin, "The United Kingdom Chemical Database Service," J. Chem. Inf. Comput. Sci. 36, 746-749 (1996) (Cited in priority U.S. Appl. No. 61/086,841).

M. S. Bhuiyan, M. Paranthaman, A. Goyal, "Deposition of rare earth tantalate buffers on textured Ni-W substrates for YBCO coated conductor using chemical solution deposition approach," Journal of Materials Research 21 (3), 767-773 (2006) (Cited in priority U.S. Appl. No. 61/086,841).

A. I. Larkin and Y. N. Ovchinnikov, "Pinning in Type-II Superconductors," Journal of Low Temperature Physics 34 (3-4) 409-428 (1979) (Cited in priority U.S. Appl. No. 61/086,841).

B. Dam, J. M. Huijbregtse, F. C. Klaassen, "Origin of high critical currents in YBa2Cu3O7-delta superconducting thin films," Nature 399 (6735) 439-442 (1999) (Cited in priority U.S. Appl. No. 61/086,841).

D. M. Feldmann, O. Ugurlu, B. Maiorov, "Influence of growth temperature on critical current and magnetic flux pinning structures in YBa2Cu3O7-x," Applied Physics Letters 91 (16) (2007) (Cited in priority U.S. Appl. No. 61/086,841).

S. Horii, K. Yamada, H. Kai, A. Ichinose, M. Mukaida, R. Teranishi, R. Kita, K. Matsumoto, Y. Yoshida, J. Shimoyama and K. Kishio, "Introduction of c-axis-correlated 1D pinning centers and vortex Bose glass in Ba-Nb-O-doped ErBa2Cu3Oy films" Supercond. Sci. Technol. 20 (2007) 1115-1119 (Cited in priority U.S. Appl. No. 61/086,841).

K. Yamada, M. Mukaida, H. Kai, R. Teranishi, A. Ichinose, R. Kita, S. Kato, S. Horii, Y. Yoshida, K. Matsumoto, and S. Toh, "Transmission electron microscopy characterization of nanorods in BaNb2O6-doped ErBa2Cu3O7-δ films", Applied Physics Letters, 92, 112503 (2008) (Cited in priority U.S. Appl. No. 61/186,841).

H. P. Rooksby and E. A. D. White, "Rare-earth niobates and tantalates of defect fluorite- and weberite-type structures" J. Amer. Ceram. Soc. vol. 47 Issue 2, p. 94 (1964) (Cited in priority U.S. Appl. No. 61/086,841).

\* cited by examiner

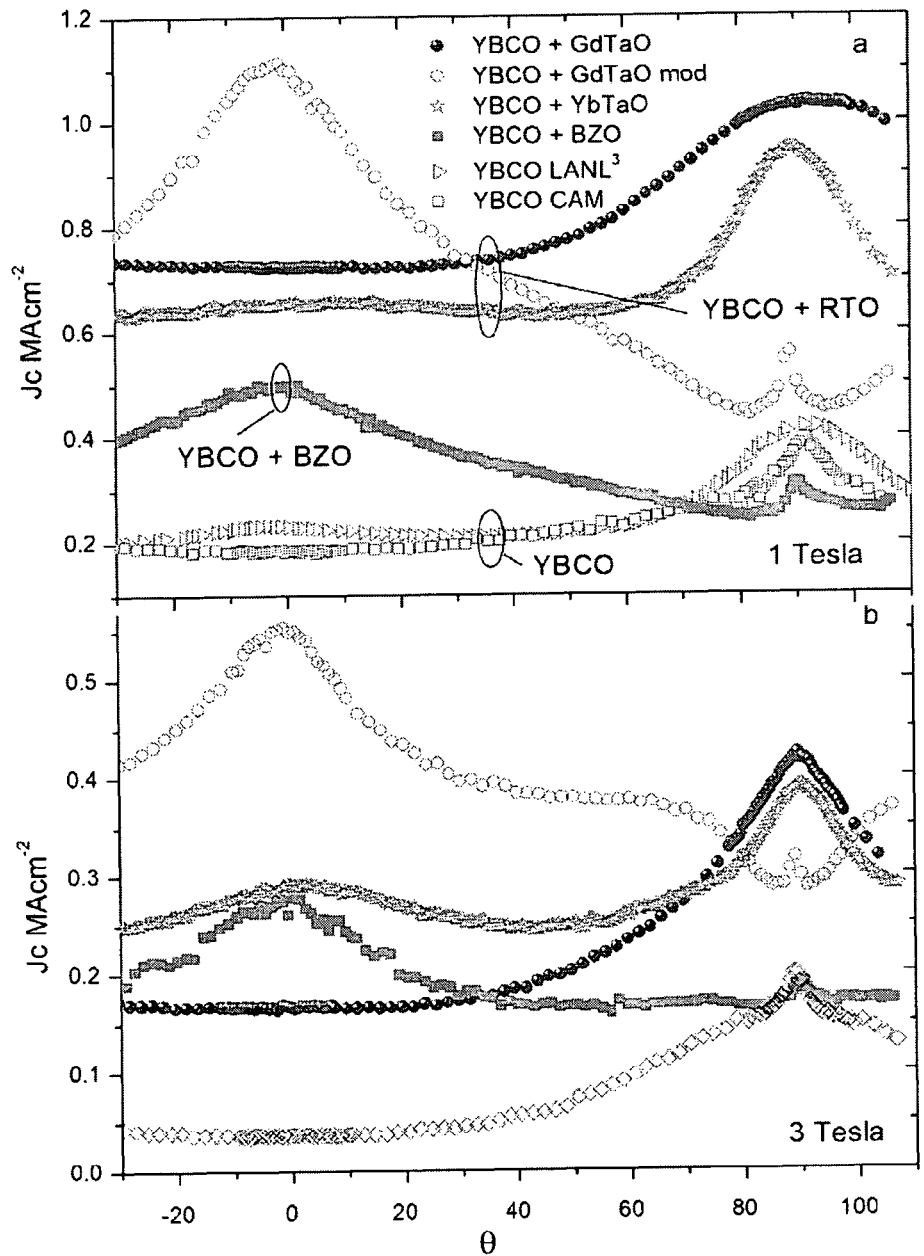

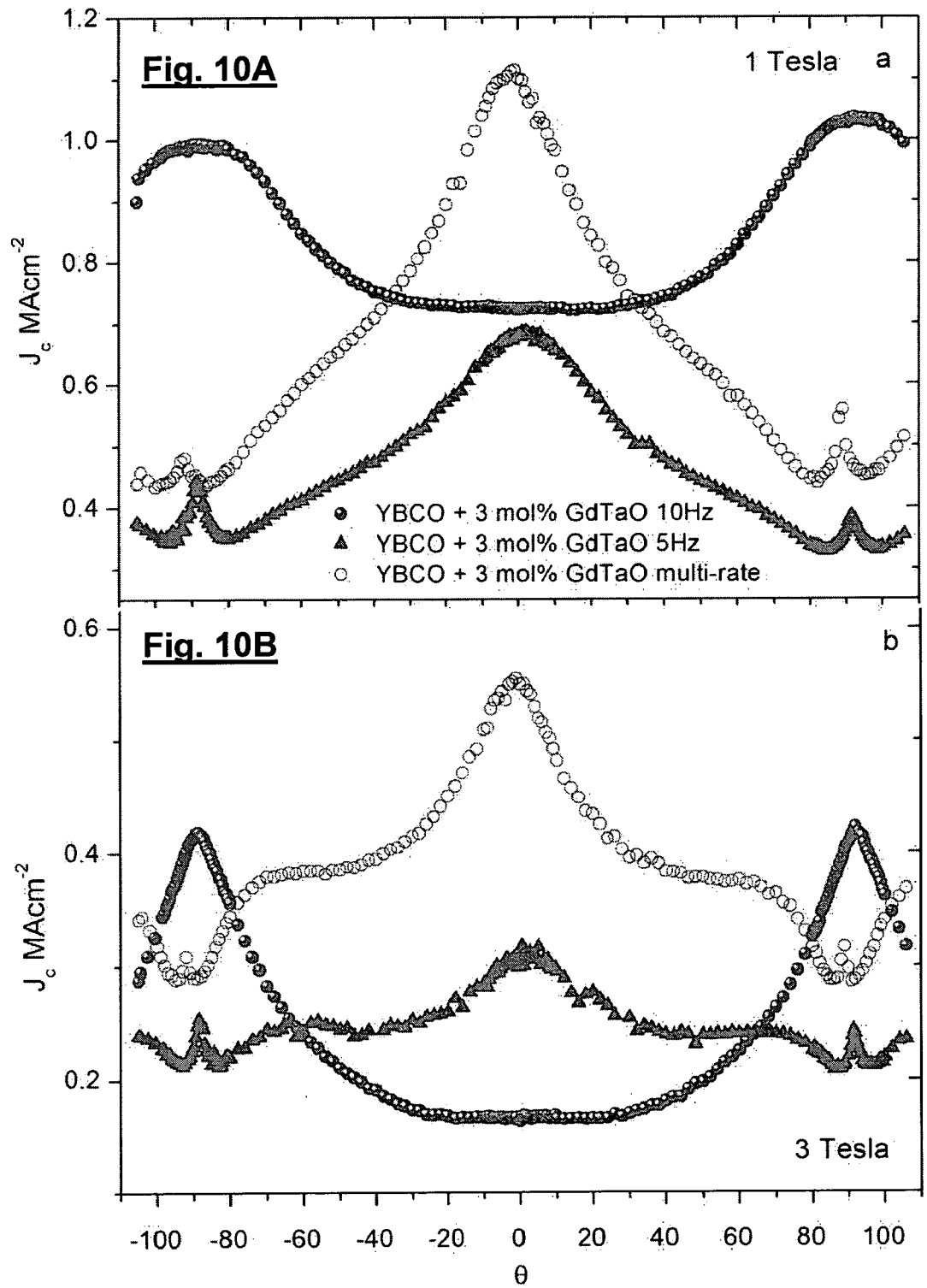

HIGH TEMPERATURE SUPERCONDUCTORS

BACKGROUND TO THE INVENTION

1. Field of the Invention

The present invention relates to high temperature superconductor compositions, electrical conductors produced using such compositions and to methods of producing such compositions and conductors.

2. Related Art

High temperature superconducting oxides include yttrium-barium-copper oxides and related materials. For example, the composition $YBa_2Cu_3O_{7-\delta}$ (referred to herein and in the academic literature as YBCO) is a superconductor at temperatures below a critical temperature $T_c$, which varies with the value of $\delta$.

Improvement of flux pinning and thus the amount of current that can be carried in YBCO (in self-field and/or in applied field) is important for achieving widespread applications of this technologically important material. Practical pinning enhancement methods developed within the last 5 years such as incorporating nanoinclusions in the film or on the substrate surface, disorder effects from rare earth (RE) modifications, and microstructural modification have all been successful to some extent in specific field and temperature regimes. These pinning enhancement methods are described further in References 1-12.

Reference 1 describes the formation of $BaZrO_3$ (BZO) particles in YBCO films grown on strontium titanate (either as a single crystal substrate, as a buffer layer on MgO single crystal, or as a buffer layer on MgO formed on nickel-based alloy). 5 mol % $BaZrO_3$ was used. Compared with similar YBCO films formed without $BaZrO_3$, the YBCO films incorporating $BaZrO_3$ provided significantly improved $J_c$ in magnetic field strengths ($\mu_0H$) up to 7 T at 75.5 K. US 2006/0025310 discloses similar subject matter to Reference 1.

Reference 12 discloses films of YBCO-BZO formed on (001) STO single crystal substrates. This document confirms, based on the angular dependence of $J_c$ with the direction of applied field, the c-axis alignment of columnar pinning centres in the YBCO-BZO film. However, $T_c$ is reduced with increasing BZO content.

Reference 13 discloses the formation of YBCO-BZO films on $CeO_2$-buffered textured nickel alloy substrates. The BZO particles are considered to have a c-axis aligned "bamboo" structure.

Reference 21 discloses the incorporation of $BaNb_2O_6$ (BNO) into $ErBa_2Cu_3O_y$ films grown on (001) STO substrates. $ErBa_2Cu_3O_y$ is structurally related to YBCO. BNO was incorporated into $ErBa_2Cu_3O_y$ at concentrations of 0.5 and 1.5 wt %. Self-field $J_c$ decreased with increasing BNO concentration at 77K, although $J_c$ at >0.5 T increased with increasing BNO concentration at 77K. TEM investigations indicated that BNO particles formed as c-axis aligned nanorods. Reference 22 suggests that the composition of the nanorods is $Ba(Er_{0.5}Nb_{0.5})O_3$.

SUMMARY OF THE INVENTION

The present inventors have realised that, for currently available pinning methodologies, there is generally strong sensitivity of performance of the finished superconductor to processing conditions. Some pinning methodologies affect the superconducting transition temperature $T_c$ (typically by reducing $T_c$), thought to be due to the pinning additions causing disordering or poisoning of the superconductor phase, and thus limiting the amount of pinning additions that can be added without seriously compromising $J_c$ at the intended operating temperature (Reference 12). In some cases, it is considered that pinning additions may segregate to grain boundaries. Furthermore, tuning the form of the pinning so that it is operative over wide angular ranges of applied field can be difficult (References 3, 10, 12, 13).

The present inventors further consider that, to date, barium perovskites with B site ions from group IV and simple binary rare earth oxides have shown good indications of useful performance in terms of nanoparticle magnetic flux pinning.

It is a preferred object of the present invention to address at least one of the above drawbacks.

Accordingly, in a first preferred aspect, the present invention provides a composition including a matrix of a high temperature superconductive oxide, with non-superconductive particles distributed in the matrix, at least some of the particles comprising at least one rare earth element (RE) and at least one of tantalum (Ta) and niobium (Nb).

In a second preferred aspect, the present invention provides an electrical conductor including a layer of the composition according to the first aspect. Typically, the layer is formed on a substrate. However, the layer may be formed within a sheath. The layer typically has dimensions such that a thickness of the layer is smaller than a width or length of the layer.

In a third preferred aspect, the present invention provides a target or group of targets for a film deposition process, the target (or group of targets) having a composition according to the first aspect or a composition corresponding to the proportion of elements required to form a composition according to the first aspect.

In a fourth preferred aspect, the present invention provides a method of manufacturing an electrical conductor, including depositing a layer of material on a substrate, the material including a matrix formed of high temperature superconductive oxide or the precursor thereof, the material further including, in addition to that stoichiometrically required to form the high temperature superconductive oxide, at least one rare earth element (RE) and at least one of tantalum (Ta) and niobium (Nb).

In a fifth preferred aspect, the present invention provides a composition comprising:
(i) at least one of Y, Nd, Sm, Eu, Gd, or a mixture thereof, in a combined amount in the range 6-9 atomic percent;
(ii) Ba in an amount in the range 13-17 atomic percent;
(iii) Cu in an amount in the range 19-26 atomic percent;
(iv) at least one rare earth element (RE), optionally additional to (i), in a combined amount in the range 0.005-4 atomic percent;
(v) one or both of Ta or Nb in a combined amount in the range 0.001-1 atomic percent;
(vi) incidental and/or trace impurities; and
(vii) balance oxygen.

Preferably, the composition comprises:
(i) at least one of Y, Nd, Sm, Eu, Gd, or a mixture thereof, in a combined amount in the range 6.5 (more preferably 7) to 8.5 (more preferably 8, or more preferably still 7.7) atomic percent;
(ii) Ba in an amount in the range 13.5 (more preferably 14) to 16.5 (more preferably 16, or more preferably still 15.5) atomic percent;
(iii) Cu in an amount in the range 19.5 (more preferably 20, or 20.5 or more preferably still 21) to 25.5 (more preferably 25, 24.5, 24 or more preferably still 23.5) atomic percent;
(iv) at least one rare earth element (RE), optionally additional to (i), in a combined amount in the range 0.01 to 3.5 (more preferably 3 or more preferably still 2.5) atomic percent;

(v) one or both of Ta or Nb in a combined amount in the range 0.001 to 0.7 atomic percent;
(vi) incidental and/or trace impurities; and
(vii) balance oxygen.

It is envisaged that any features of any of the aspects of the invention may be combined with each other to reach further aspects of the invention.

Further preferred and/or optional features of the invention are set out below. These may be applied either singly or in any combination with any aspect of the invention, unless the context demands otherwise.

Preferably, the rare earth element (RE) is selected from one or more of scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tu), ytterbium (Yb) and lutetium (Lu). The rare earth element (RE) may be selected from any subset of this group of elements. More preferably, the rare earth element (RE) is selected from one or more of ytterbium (Yb), erbium (Er), gadolinium (Gd) and samarium (Sm). The non-superconductive particles are typically oxide particles.

Preferably the rare earth element within the pinning centres is provided at a concentration of at least 0.01 atomic percent relative to the total composition. More preferably, the rare earth element is provided at a concentration of at least 0.1 atomic percent or at least 1 atomic percent relative to the total composition. The upper limit for this range may be about 4 atomic percent, for example.

Preferably the Ta and/or Nb within the pinning centres is provided at a concentration of at least 0.001 atomic percent relative to the total composition. More preferably, the Ta and/or Nb is provided at a concentration of at least 0.01 atomic percent or at least 0.1 atomic percent relative to the total composition. The upper limit for this range may be about 1 atomic percent, for example.

Preferably the superconductive oxide is a superconductor at 77 K in zero applied magnetic field. Preferably the non-superconductive particles are not superconducting at 77 K.

Preferably a majority (e.g. by volume) of the non-superconductive particles conform to the phase $A_aB_bO_z$, where A is RE and B is Ta or Nb. Preferably a is 3 or about 3. Preferably b is 1 or about 1. Preferably z is 7 or about 7. The phase $A_aB_bO_z$ may have a crystal structure selected from cubic defect fluorite (e.g. pyrochlore type) and orthorhombic weberite. Such crystal structures are described in Reference 23, the content of which is hereby incorporated by reference in its entirety.

Preferably the high temperature superconductive oxide is a copper oxide. More preferably, the high temperature superconductive oxide is a barium copper oxide. In one preferred embodiment, the high temperature superconductive oxide is an yttrium barium copper oxide (YBCO, i.e. $YBa_2Cu_3O_{7-\delta}$ but may be $Y_2Ba_4Cu_7O_{14-x}$ or $YBa_2Cu_4O_8$), erbium barium copper oxide, samarium barium copper oxide, neodymium barium copper oxide, europium barium copper oxide or gadolinium barium copper oxide. Alternatively, the high temperature superconductive oxide is a bismuth-based copper oxide such as bismuth strontium calcium copper oxide. For example, BiSCCO-2212 ($Bi_2Sr_2CaCu_2O_{8+\delta}$) or BiSCCO-2223 ($Bi_2Sr_2Ca_2Cu_3O_{10+\delta}$) may be used.

On the basis of the predominant phase of superconductive oxide and on the basis that the non-superconductive particles conform to the phase $A_aB_bO_z$, as set out above, it is preferred that the non-superconductive particles are provided in the superconductive oxide particle matrix at a concentration of at least 0.05 mol %. Preferably this lower limit is at least 0.1 mol %, at least 0.5 mol % or at least 1 mol %. It is further preferred that the non-superconductive particles are provided in the superconductive oxide particle matrix at a concentration of at most 10 mol %.

Preferably, the electrical conductor, at a temperature of 77K or below, is a superconductor, at least in zero or substantially zero applied magnetic field.

Preferably, the layer is aligned so that the c-axis of at least one crystal grain of the high temperature superconductive oxide is aligned substantially parallel to the thickness direction of the layer. The layer may itself be a substantially epitaxial layer on a single crystal substrate or on a buffer layer or buffer layers formed on a single crystal substrate. Alternatively, the layer may be formed on a metallic substrate, preferably a metallic substrate having grain texture, such as biaxially aligned grain texture. Such substrates are known. It is further preferred that one or more buffer layers are formed between the metallic substrate and the layer of superconductive oxide. Such buffer layers typically prevent or reduce deleterious chemical reaction products between the substrate and the components of the superconductive oxide layer.

One result of such preferred alignment is that a $\theta$-$2\theta$ X-ray diffraction pattern taken from the layer of the high temperature superconductive oxide demonstrates substantially higher (001) peaks than a corresponding powder $\theta$-$2\theta$ X-ray diffraction pattern taken from the same composition.

Preferably at least a majority (by volume) of the non-superconductive particles in the superconductive oxide matrix have a preferred crystallographic alignment with the matrix. For example, at least one crystallographic axis of the non-superconductive particles may be aligned parallel to the c-axis of the superconductive oxide matrix. Furthermore, another crystallographic axis of the non-superconductive particles may be aligned at an alignment angle to another crystallographic axis of the matrix. For example, the a-axis of the non-superconductive particles may be aligned at an angle L with respect to the a-axis of the matrix. Preferably L is in the range of about 30-60°, more preferably 40-50°, most preferably about 45°.

Preferably, the conductor has a total length of superconductive oxide layer of at least 10 cm, more preferably at least 0.5m or at least 1 m. The conductor may be used in applications including power cables, magnets, electrical interconnects, etc., at liquid nitrogen temperatures.

Preferably, at least some of the non-superconductive particles have a columnar morphology. Most preferably, the principal axis of the non-superconductive particles is substantially aligned with the c-axis of the superconductive matrix. Additionally or alternatively, at least some of the non-superconductive particles may be aligned with each other so as to form particle stacks formed of at least two such particles. Preferably, the principal axis of the particle stacks is substantially aligned with the c-axis of the superconductive matrix. The particles preferably have a mean particle size in the range 1-20 nm, more preferably 2-10 nm, most preferably about 5 nm.

The typical distribution of the nanorods in the superconductive oxide layer is at least $0.01 \times 10^{15}$ m$^{-2}$, when determined as the number of nanorods intersecting an image plane substantially perpendicular to the c-axis of the superconductive oxide using TEM. Preferably, the lower limit for this range is at least $0.1 \times 10^{15}$ m$^{-2}$, more preferably $0.5 \times 10^{15}$ m$^{-2}$, more preferably $1 \times 10^{15}$ m$^{-2}$. The upper limit for this range is preferably $10 \times 10^{15}$ m$^{-2}$, more preferably $5 \times 10^{15}$ m$^{-2}$, more preferably $2 \times 10^{15}$ m$^{-2}$.

Preferably the thickness of the layer of superconductive oxide is at least 50 nm. More preferably, this thickness is at least 100 nm, at least 150 nm, at least 200 nm, at least 250 nm, at least 300 nm, at least 350 nm, at least 400 nm, at least 450 nm or at least 500 nm. The layer of superconductive oxide preferably has a thickness of 10 µm or less, more preferably 5 µm or less, more preferably 3 µm or less. The upper limit generally comes about due to the difficulty in ensuring alignment of the superconductive oxide as the distance (height) from the substrate increases.

Preferably, in an applied magnetic field of at least 0.5 T parallel to the c-axis of the superconductive oxide, the transport $J_c$ at 77 K of the conductor is at least 0.3 MA·cm$^{-2}$ (more preferably at least 0.7 MA·cm$^{-2}$). Preferably, in an applied magnetic field of at least 1 T parallel to the c-axis of the superconductive oxide, the transport $J_c$ at 77 K of the conductor is at least 0.2 MA·cm$^{-2}$ (more preferably at least 0.6 MA·cm$^{-2}$). Preferably, in an applied magnetic field of at least 5 T parallel to the c-axis of the superconductive oxide, the transport $J_c$ at 77 K of the conductor is at least 0.1 MA·cm$^{-2}$ (more preferably at least 0.2 MA·cm$^{-2}$).

Preferably, the method of manufacturing the electrical conductor further includes at least one heat treatment, which may be at the same time as the deposition step and/or subsequent thereto, in which heat treatment non-superconductive particles are formed, distributed in the matrix, said particles including said at least one rare earth element (RE) and at least one of tantalum (Ta) and niobium (Nb). Preferably the heat treatment is carried out in the temperature range 750-800° C.

The superconductive oxide layer may be deposited by, for example, pulsed laser deposition. However, other deposition methods are contemplated, such as evaporation (including coevaporation, e-beam evaporation and activated reactive evaporation), sputtering (including magnetron sputtering, ion beam sputtering and ion assisted sputtering), cathodic arc deposition, chemical vapor deposition, organometallic chemical vapor deposition, plasma enhanced chemical vapor deposition, molecular beam epitaxy, a sol-gel process, liquid phase epitaxy, hybrid liquid phase epitaxy, polymer assisted deposition, atomic layer deposition, trifluoroacetic acid (TFA) method and the like.

Preferably, during growth of the superconductive oxide layer, the growth conditions are controlled so as to provide both an array of columnar pinning sites and randomly distributed pinning particles. In the case of pulsed laser deposition, for example, this may be achieved by providing at least one period of relatively ordered growth (relatively slower pulse rate) and at least one period of relatively misordered growth (relatively faster pulse rate).

Further preferred and/or optional features will be apparent from the detailed description of the preferred embodiments set out below.

BRIEF DESCRIPTION OF THE DRAWINGS

Preferred embodiments of the present invention are described in detail below, with reference to the accompanying drawings, in which:

FIG. 9 shows the angular dependence of the critical current density ($J_c$) at 77K for an YBCO film without doping additions and for BZO- and RTO-doped YBCO films. FIG. 9A shows results for 1 T applied field, FIG. 9B shows results for 3 T applied field.

FIG. 10 shows the angular dependence of the critical current density at 77K for 5 Hz, 10 Hz and multi-rate $Gd_3TaO_7$ doped YBCO films formed using a 795° C. growth temperature and having thickness of 0.5 µm thickness. FIG. 10A shows results for 1 T applied field, FIG. 10B shows results for 3 T applied field.

Figures 1A, 1B:
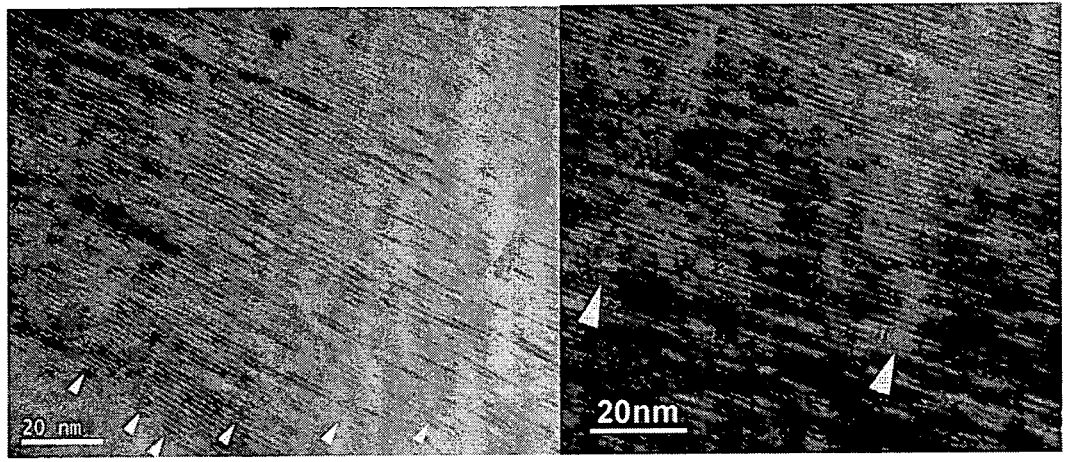
FIGS. 1A and 1B show TEM cross-sectional images of a 5 mol % ErTaO doped YBCO film on a single crystal STO substrate.

DETAILED DESCRIPTION OF PREFERRED EMBODIMENTS, FURTHER PREFERRED AND/OR OPTIONAL FEATURES

The present inventors identified the rare-earth tantalate $RETa_3O_7$ (RTO) series as a candidate for providing improved nanoparticle pinning in YBCO and related superconductive oxides. In the view of the present inventors, and without wishing to be bound by theory, RTO series compounds have high stability with melting points above 2200° C. (Reference 14). Furthermore, it is considered that Ta does not substitute into the YBCO lattice (Reference 15). Additionally, there is reasonable lattice (mis)match with YBCO (Reference 16) and the induced strain is tunable by appropriate RE selection, from 2.37% for La up to 4.8% for Yb. RTO has also been demonstrated to be a suitable buffer layer between YBCO and metallic substrates indicative of epitaxial growth of one phase on another (Reference 17).

In reaching the present invention, the inventors have provided RTO pinning centres in YBCO as exemplary embodiments of the present invention. The resultant superconductor structures preferably show very strong, reproducible and/or tunable pinning enhancements over a wide field magnitude and angular range. In films of thickness of a half-micron (0.5×10$^{-6}$ m) at 77K, $J_c$s of 1.2 MA·cm$^{-2}$ (0.55 MA·cm$^{-2}$ and 0.2 MA·cm$^{-2}$) were achieved at 1 T (the values in brackets show $J_c$ at 3 T and 5 T, respectively). These values surpass state-of-art published values in even very thin (200 nm) PLD films with more than a doubling in $J_c$ up to the 5 T measured (References 12 and 3). This strong enhancement is considered to be because (again, without wishing to be bound by theory) RTO forms ideal, flux core-sized pinning nanorods as well as providing a narrow size distribution of randomly arranged nanoparticles.

PLD targets were made by mixing commercial YBCO powder (SCI Engineered Materials) with $Ta_2O_5$ and $RE_2O_3$ (RE=Gd, Er, Yb) to give 1, 3, 5 and 8 mol % $RETa_3O_7$ addition powder compositions. Targets were pressed and sintered from the powders at 985° C. for 12 hours in flowing $O_2$. Films of 0.5-1.0 µm thickness were grown on (001) STO substrates (Pi-Kem Ltd.), by pulsed laser deposition from a Lambda Physik KrF excimer laser (λ=248 nm) in 30 Pa flowing oxygen in the temperature range 765-795° C. Laser repetition rates of 5 Hz (single rate), 10 Hz (single rate), and also multi-rates of 5 Hz and 10 Hz with 4500 pulses each were used.

E-J characteristics were measured on photolithographically patterned bridges of around 125 μm width using conventional four point measurement geometry. A 1 μV/cm electric field criterion was used to determine values of critical current. An applied magnetic field was rotated in a plane perpendicular to the direction of the current flow to an angle θ with respect to the a-b planes of the films, at either 77 K or 75.5 K. $J_c$ values measured at 75.5 K were reduced by 10% (self-field), 15% (1 T) and 20% (3 T) to account for the temperature difference (Reference 3). Surface morphology and film thickness were observed using both conductive and tapping mode atomic force microscopy (AFM). The crystallographic structure and orientation of the films were studied using high-resolution x-ray diffraction and transmission electron microscopy (TEM).

FIG. 1A shows a cross sectional TEM image of a 5 mol % ErTO YBCO sample. Self-assembled columns of RTO (in this case ErTO particles) of width 5 nm are observed aligned with the c-axis of the YBCO. The columns are typically spaced 10-20 nm apart in the a-b plane and extend through the whole film thickness. It has been observed that BZO particles in YBCO tend to grow with increasing deviation away from the c-axis of the YBCO with increasing height from the substrate. This is considered to reduce the effectiveness of these particles for pinning. Such morphology has not been observed to the same degree in the present examples. Instead, the self-assembled columns of RTO tend to have a longer c-axis aligned linear region with height before deviation from the c-axis.

In a slightly higher magnification image (FIG. 1B), randomly-distributed particles of diameter about 10 nm are observed between the columns.

The lattice planes of the particles within the columns align substantially perfectly with the lattice planes of the YBCO and are distinguishable only due to the different phase contrast.

Figure 2:
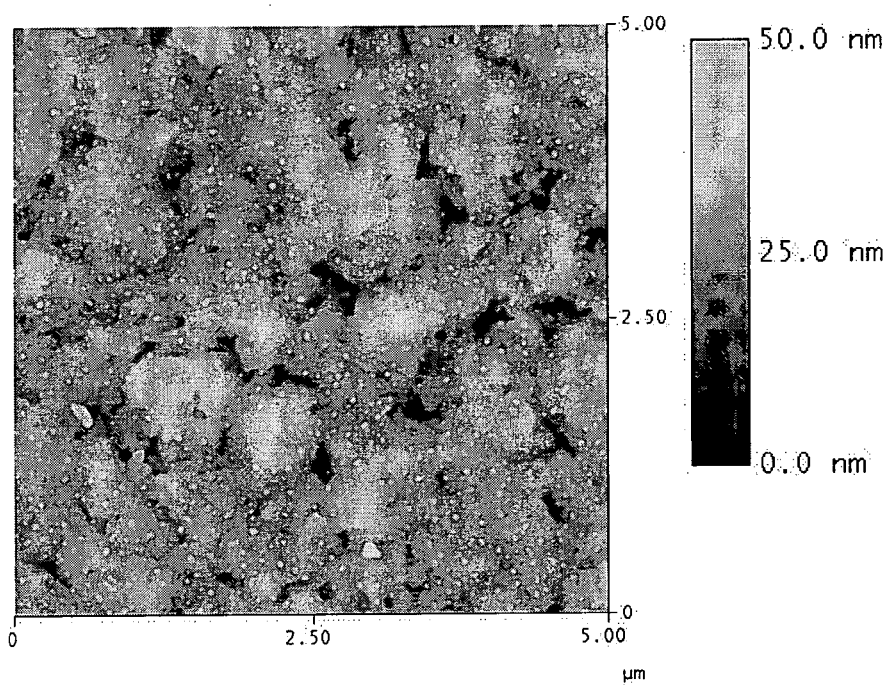
FIG. 2 shows a tapping mode AFM image of the surface of a 5 mol % YbTaO doped YBCO film formed on a single crystal STO substrate.

In all samples a homogeneous spatial distribution of the second phase, in general, was found. This agrees with the results of a surface AFM analysis, a micrograph from which is shown in FIG. 2. This micrograph shows a distribution of small particles at the surface of the YBCO film. Conductive AFM was used to confirm that these particles are insulating, and thus that they are not YBCO particles (YBCO is electrically conductive at the analysis temperature). Selected area TEM diffraction confirms the phase of the particles indicated in the TEM micrographs to be $RE_3TaO_7$.

Figure 3:
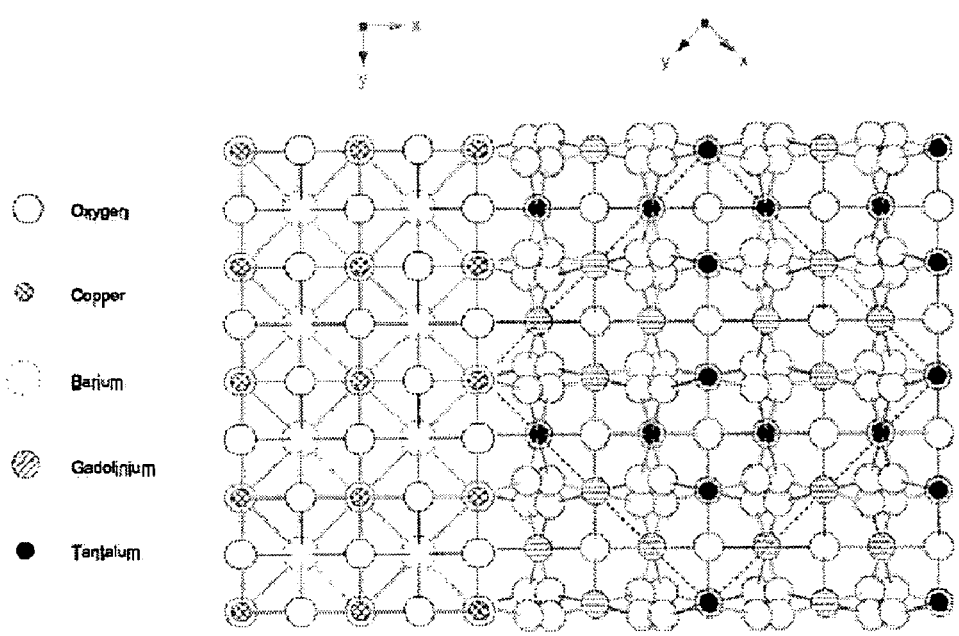
FIG. 3 shows a modelled crystal structure and orientation of pinning phase $RE_3TaO_7$ in relation to a c-axis view of YBCO.

FIG. 3 shows the result of crystallographic modelling of the likely lattice matching at an interface between an YBCO lattice (left hand side) and a $Gd_3TaO_7$ interface looking down the c-axis of the YBCO structure. The Y ions are not shown because they are hidden in this view by the barium ions located directly above them in the c-axis direction.

Figure 5:
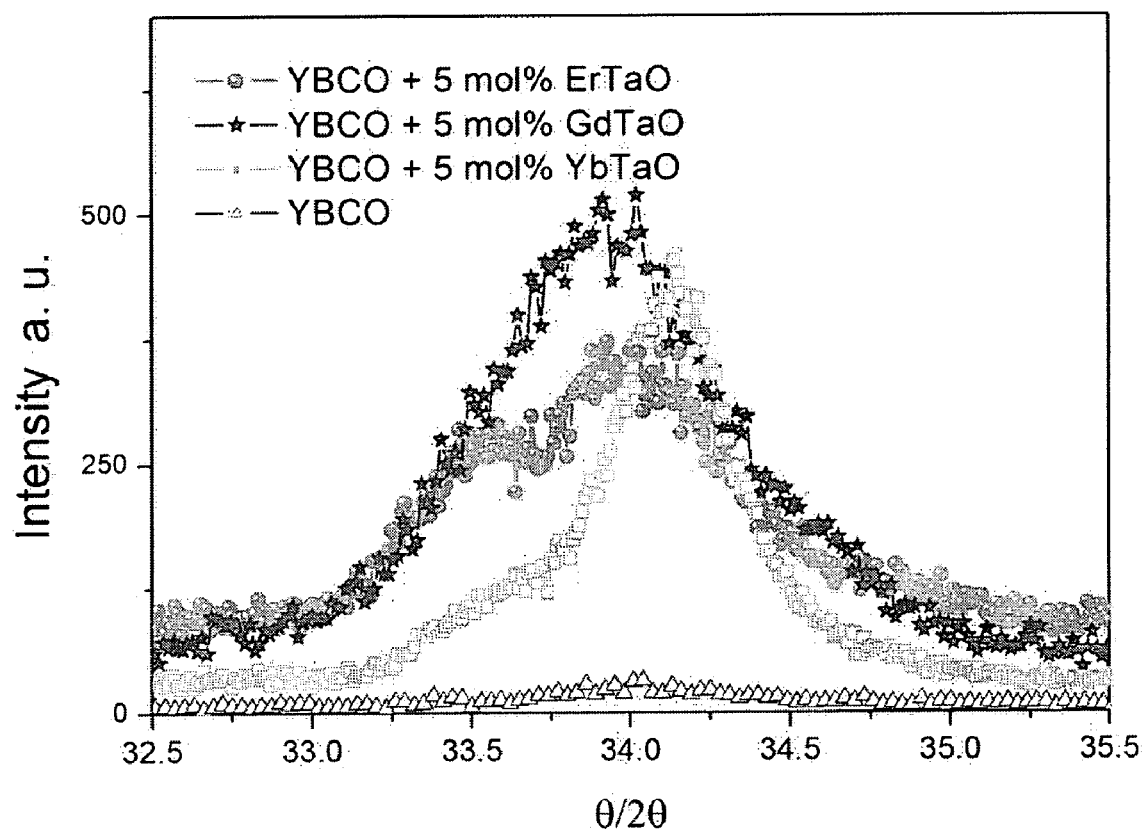
FIG. 5 shows a θ/2θ scan showing (004) GdTO, ErTO and YbTO peaks for YBCO films formed on STO single crystal substrates with corresponding GdTO, ErTO and YbTO doping additions.

In FIG. 3, the cubic RTO (GdTO) crystal structure has a lattice parameter a=1.0651 nm. The [110] direction in this cubic RTO crystal structure matches along a or b of the YBCO crystal structure with a 4:1 ratio. This is confirmed by x-ray phi scans of the (044) RTO peak, shown in FIG. 4B. This indicates that the a and b directions in the RTO lattice are rotated by 45° with respect to the a and b directions in the YBCO lattice, corresponding to the dashed square outline in FIG. 3. This rotation is in the plane of the STO substrate, i.e. about an axis perpendicular to the plane of the STO substrate.

θ-2θ X-ray diffraction of the films shows clear (001) peaks from YBCO as well as the (004) RTO peak. FIG. 5 shows the position of the (004) peak for 5 mol. % RTO films. As suggested in Reference 17, a shift to higher angles is observed with decreasing lattice parameter, corresponding to reducing the RE ionic radii, $r_{Yb} < r_{Er} < r_{Gd}$.

Figure 6:
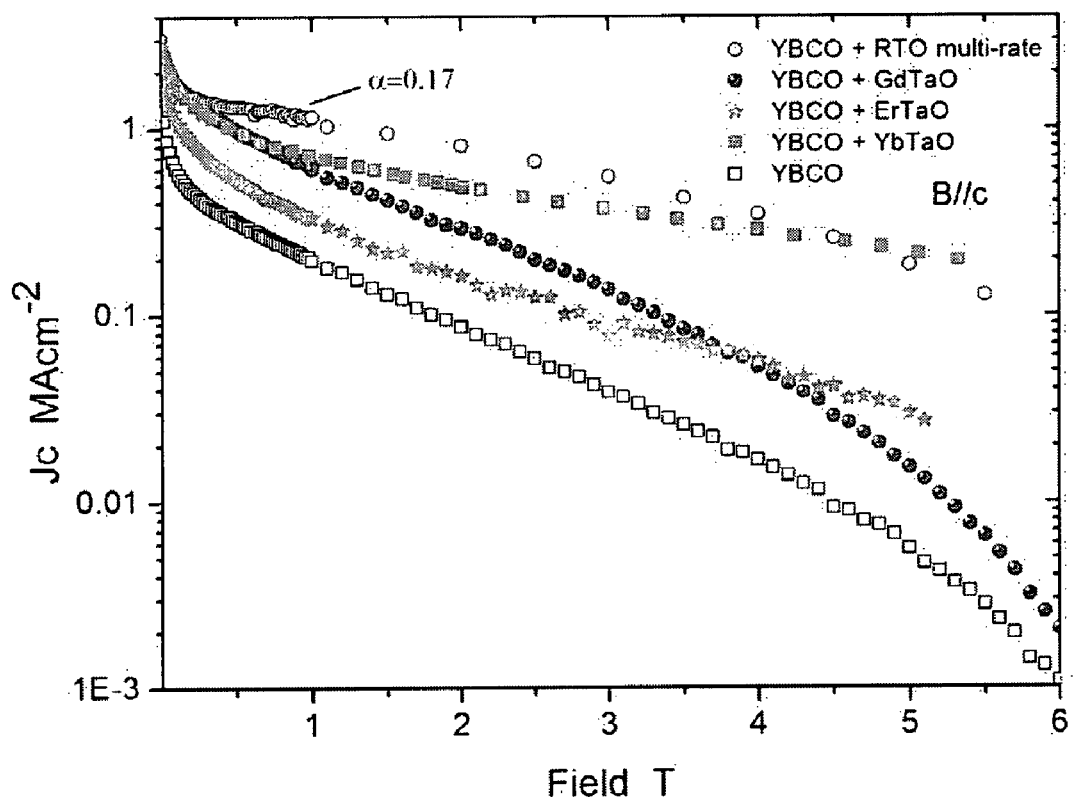
FIG. 6 shows the field dependence of critical current density at 77K, θ=0.

FIG. 6 shows the variation of $J_c$ with applied field at 77 K (or equivalent) for different YBCO films, the magnetic field being applied parallel to the YBCO c-axis. A significant enhancement of $J_c$ is shown for fields parallel to the c-axis for the RTO samples of 3-5 mol % level compared to pure YBCO, samples of 8 mol % additions showed no apparent improvement over 5 mol %. The GdTO doping was at a 3 mol % level whilst the ErTO and YbTO doping was at a 5 mol %. FIG. 6 also shows a $J_c$ vs applied field curve for a multi-rate sample.

As shown in FIG. 6, the pinning in the single rate samples is improved for 3 mol % RTO doping at low fields with a crossover at higher fields for the 5 mol % RTO doping. According to the present state of the inventors' work in this area, there is no substantial variation in $J_c$ vs applied field performance when the type of RE ion is varied.

The present inventors consider that strong pinning is vortex pinning by a single pin (random) or assembly of aligned pins (correlated pinning). This is the opposite limit from collective pinning (see Reference 18), in which vortex forces are much stronger than the interaction between vortices and weak point pins where only variations in pin density or vortex lattice distortion give rise to pinning. At 0K the coherence length in YBCO is about 1.6 nm. Given that $\Psi(T)=\Psi_o 1/\sqrt{1/(T/T_c)}$ near $T_c$, the present inventors estimate the coherence length at 77K in these samples to be about 2.5 nm. This means that there is a very good correspondence between the vortex core diameter and the 5 nm particle size observed by TEM.

$J_c(B)$ is often described with a value alpha, this value is determined by fitting $J_c$ proportionate to $J_{c,sf} B^{-\alpha}$ to the critical current field characteristic. While this is often a rough fit it provides a convenient way of describing how well $J_c$ is maintained with field. The multi-rate sample displays a distinct plateau of $J_c$ in field giving rise to an alpha value of 0.17, between 0.1 and 2 T and the distribution of particles corresponds to a matching field of 5 T (for pure YBCO alpha is approximately 0.5).

Figure 7:
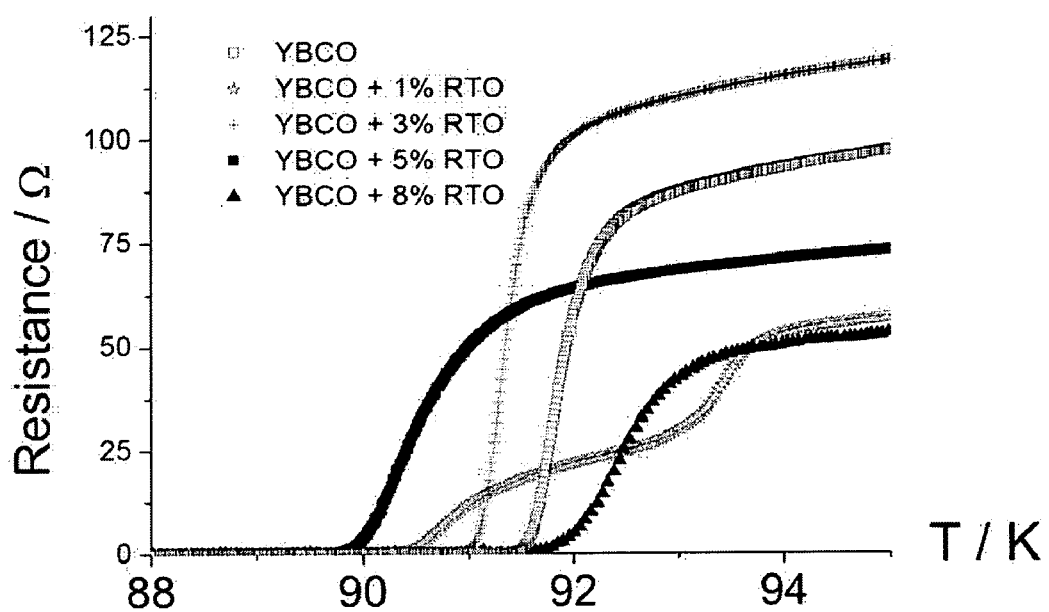
FIG. 7 shows R(T) curves for YBCO films with 1-8 mol % RTO doping.

FIG. 7 shows resistive $T_c$ measurements for films with 1-8 mol % GdTO. No reduction in $T_c$ is observed even at 8 mol %, an additional indication of the lack of poisoning or disordering of the YBCO by the RTO.

Figure 8:
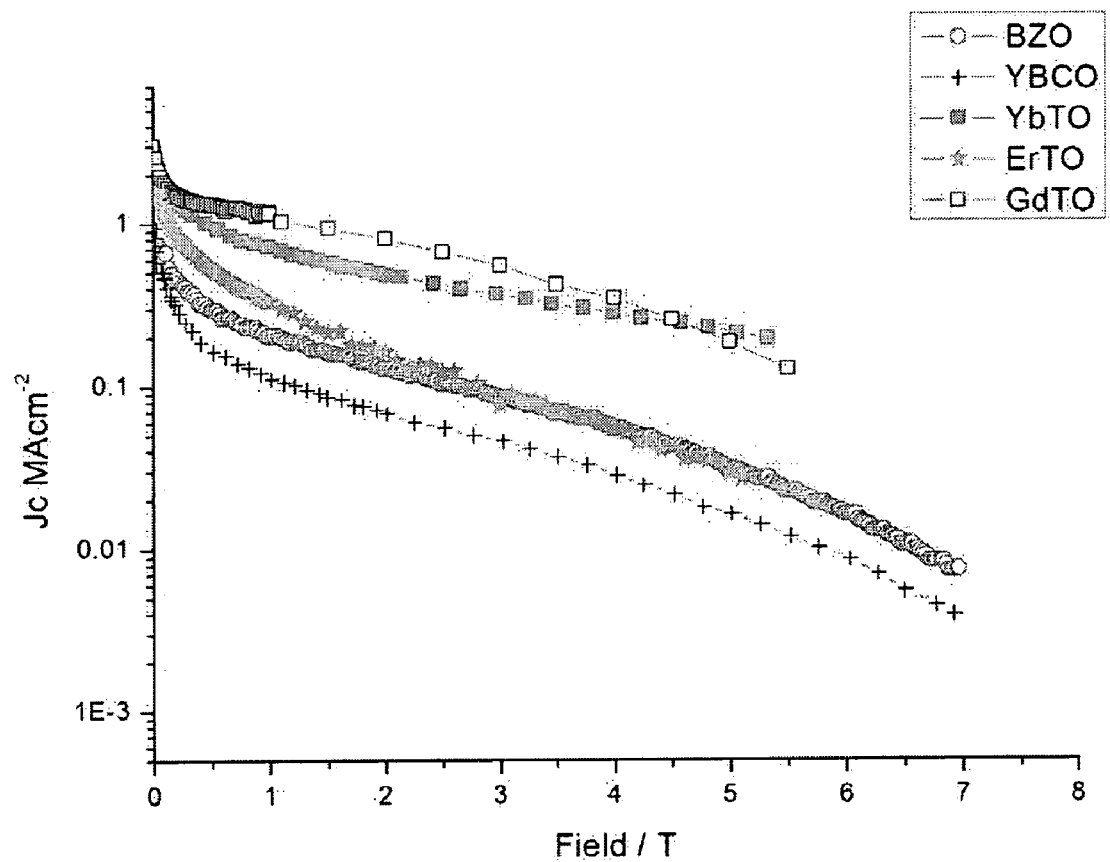
FIG. 8 shows the field dependence of critical current density at 77K, θ=0.

FIG. 8 shows a similar graph to FIG. 6, except that a curve is also shown for YBCO with BZO doping, but the curve for YBCO plus GdTO (non-multi-rate) is not shown.

FIG. 9A shows angular dependent $J_c$ measurements taken at 1 T, for RTO-YBCO films with 3-5 mol % RTO additions. The data is compared to two standard PLD YBCO films of about 0.5 μm thickness, together with a high quality BZO-YBCO film, of similar thickness (Reference 3). With the exception of the mixed rate film all films were grown at a laser repetition rate of 10 Hz. The excellent performance of the RTO-YBCO films over the entire angular range is clear from this graph, with maximum $J_c$ values of about 1.2 MA·cm$^{-2}$, demonstrating an improvement over BZO-YBCO film, and indeed the reported data of any nanoparticle additive by any growth route except for extremely thin films less than about 200 nm. As is evidenced by the overall shift upward in $J_c$ for the two 10 Hz films compared to the YBCO films, there is strong random component to the pinning. A high level of reproducibility is apparent even for the 30° C. deposition temperature window and the different rare earth elements used.

FIG. 9B shows the performance of the same set of films as in FIG. 9A except this time measured in an applied field of 3 T. Again, excellent performance is observed with $J_c$ of 0.55 MA·cm$^{-2}$ superseding previously reported data by a factor of about 2.5. The importance of c-axis correlated pinning is clear at these higher fields since the c-axis axis (broad peak at theta=0°) becomes more apparent particularly for the YbTO sample. The dominance of c-axis correlated pinning over random pinning in the BZO-YBCO sample now becomes apparent as the c-axis peak in the sample is now of similar magnitude to the RTO-YBCO 10 Hz films.

For BZO, it has been shown that relative weighting of the random versus correlated pinning can be tuned through kinetic control (Reference 20) and that multilayers of differing contributions can be effective (Reference 13). The kinetic effect was studied for RTO by growing films at different laser repetition rates. The multi-rate sample in FIGS. 9A and 9B shows a large c-axis peak both at 1 and 3 T. The form of the angular data is similar to BZO-YBCO except with an overall upward shift because of both stronger random pinning and relatively stronger c-axis correlated pinning (larger c-axis peak). The data is consistent with the TEM images (FIGS. 1A and 1B) which show the very fine, even sized nanoparticles and columns that can be produced with RTO additions to YBCO.

Figure 4A:
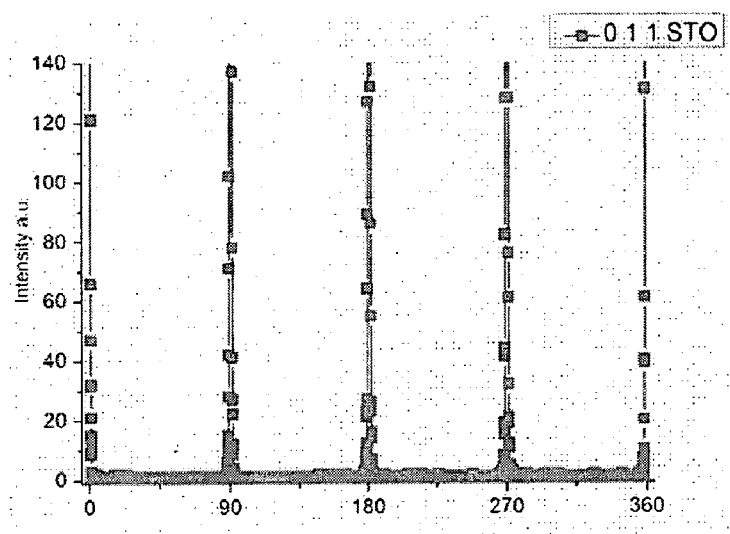
FIGS. 4A, 4B and 4C show phi scans of the (011) $SrTiO_3$, (044) $Gd_3TaO_7$, and (102) YBCO peaks (respectively) for a GdTO doped YBCO film formed on single crystal STO.
Figure 4B:
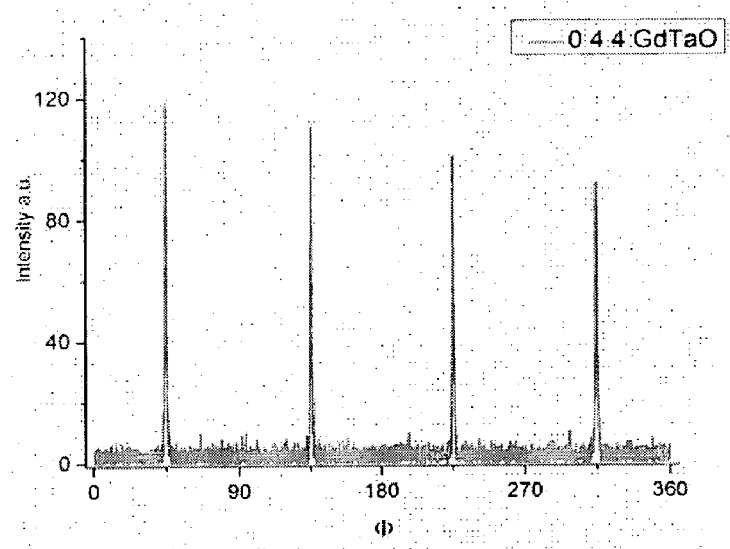
Figure 4C:
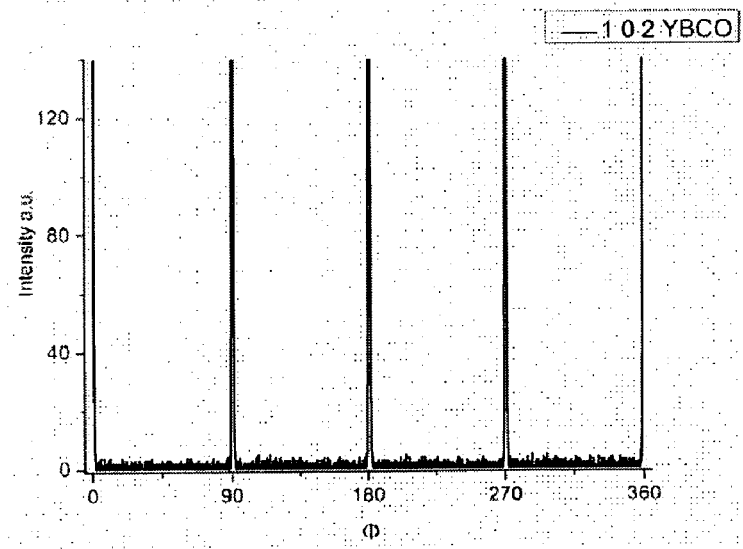

The excellent tunability of the random versus correlated pinning in RTO-YBCO is demonstrated in FIG. 10A where a 5 Hz grown sample is compared to the samples of FIGS. 4A-C. The 5 Hz sample shows a relatively stronger c-axis peak than the 10 Hz sample where there is more random pinning because the growth rate is faster and particles do not have time to order into columns.

As expected, higher PLD rates produce more random pinning (overall shift upwards of the $J_c$ vs angle of applied field whilst maintaining the angular shape of pure YBCO). The effectiveness of the random pinning at lower fields (1 T) is clear. For higher fields, FIG. 10B shows corresponding date for a 3 T applied field. Here the data crosses over as the c-axis correlated pinning of the lower rate films begins to dominate. The effect is reproducible and controllable for the different rare earth elements. Combination of the desirable pinning from both the low and high growth rate films was achieved by switching of the growth rate between 5 Hz and 10 Hz during the deposition.

In conclusion, $T_c$ in RTO samples was found to be independent of doping level at least up to 8 mol %. RTO forms a stable secondary phase in YBCO, readily assembling into c-axis correlated nano-particles. In the 30° C. substrate temperature range studied there was little effect on the magnitude or angular $J_c$ characteristics, with excellent critical current films being grown at temperatures as low as 765° C. Changing the kinetics of the film growth via pulse rate selection is a powerful tool to tune the angular dependence and improve flux pinning. Superior flux pinning is observed in all RTO films grown with $J_c$ up to 1.2 MA·cm$^{-2}$ at 1 T and improved flux pinning throughout the entire angular and field ranges.

The above embodiments have been described by way of example. On reading this disclosure, modifications of these embodiments, further embodiments and modifications thereof will be apparent to the skilled person. In particular, the disclosure here may be applied to the formation of longer lengths of conductor, e.g. to superconductive oxides formed on buffered biaxially aligned metallic substrates formed from nickel or nickel alloys. Such longer lengths of conductor may be formed into power lines or wound to form solenoids.

List of Journal References

1 J. L. Macmanus-Driscoll, S. R. Foltyn, Q. X. Jia et al., "Strongly enhanced current densities in superconducting coated conductors of $YBa_2Cu_3O_{7-x}$+$BaZrO_3$," Nature Materials 3 (7), 439-443 (2004).

2 T. Haugan, P. N. Barnes, R. Wheeler et al., "Addition of nanoparticle dispersions to enhance flux pinning of the $YBa_2Cu_3O_{7-x}$ superconductor," Nature 430 (7002), 867-870 (2004).

3 S. R. Foltyn, L. Civale, J. L. Macmanus-Driscoll et al., "Materials science challenges for high-temperature superconducting wire," Nature Materials 6 (9), 631-642 (2007).

4 Y. Yoshida, K. Matsumoto, Y. Ichino et al., "High-critical-current-density epitaxial films of $SmBa_2Cu_3O_{7-x}$ in high fields," Japanese Journal Of Applied Physics Part 2-Letters & Express Letters 44 (1-7), L129-L132 (2005).

5 S. R. Foltyn, H. Wang, L. Civale et al., "Overcoming the barrier to 1000 A/cm width superconducting coatings," Applied Physics Letters 87 (16) (2005).

6 V. F. Solovyov, H. J. Wiesmann, L. Wu et al., "High critical currents by isotropic magnetic-flux-pinning centres in a 3 μm-thick $YBa_2Cu_3O_7$ superconducting coated conductor," Superconductor Science & Technology 20 (4), L20-L23 (2007).

7 R. Feenstra, A. A. Gapud, F. A. List et al., "Critical currents I-c(77 k)>350 A/cm-width achieved in ex situ YBCO coated conductors using a faster conversion process," IEEE Transactions On Applied Superconductivity 15 (2), 2803-2807 (2005).

8 J. L. MacManus-Driscoll, S. R. Foltyn, B. Maiorov et al., "Rare earth ion size effects and enhanced critical current densities in $Y_{2/3}Sm_{1/3}Ba_2Cu_3O_{7-x}$ coated conductors," Applied Physics Letters 86 (3) (2005).

9 X. Wang, A. Dibos, and J. Z. Wu, "Weakening thickness dependence of critical current density in $YBa_2Cu_3O_{7-x}$ films using nanotube pore insertion," Physical Review B 77 (14) (2008).

10 P. Mele, K. Matsumoto, T. Horide et al., "Incorporation of double artificial pinning centers in $YBa_2Cu_3O_{7-d}$ films," Superconductor Science & Technology 21 (1) (2008).

11 J. Hanisch, C. Cai, R. Huhne et al., "Formation of nano-sized $BaIrO_3$ precipitates and their contribution to flux pinning in Ir-doped $YBa_2Cu_3O_{7-delta}$ quasi-multilayers," Applied Physics Letters 86 (12) (2005).

12 V. Galluzzi, A. Augieri, L. Ciontea et al., "$YBa_2Cu_3O_{7-delta}$ films with $BaZrO_3$ inclusions for strong-pinning in superconducting films on single crystal substrate," IEEE Transactions On Applied Superconductivity 17 (2), 3628-3631 (2007).

13 H. Kobayashi, Y. Yamada, A. Ibi et al., "Investigation of in-field properties of YBCO multi-layer film on PLD/IBAD metal substrate," Physica C-Superconductivity And Its Applications 463, 661-664 (2007).

14 M. Yoshimura, Y. Yokogawa, and S. Somiya, "Solidification Points For The Fluorite-Related Phases Of $R_3$ $TaO_7$ (R=Rare-Earth)," Journal Of Materials Science Letters 5 (10), 1022-1024 (1986).

15 G. W. Kammlott, T. H. Tiefel, and S. Jin, "Recovery Of 90 K Superconductivity In Transition-Metal-Doped Y—Ba—Cu—O," Applied Physics Letters 56 (24), 2459-2461 (1990).

16 D. A. Fletcher, McMeeking, R. F., Parkin, D., "The United Kingdom Chemical Database Service," J. Chem. Inf. Comput. Sci. 36, 746-749 (1996).

17 M. S. Bhuiyan, M. Paranthaman, A. Goyal et al., "Deposition of rare earth tantalate buffers on textured Ni—W substrates for YBCO coated conductor using chemical solution deposition approach," Journal Of Materials Research 21 (3), 767-773 (2006).
18 A. I. Larkin and Y. N. Ovchinnikov, "Pinning In Type-II Superconductors," Journal Of Low Temperature Physics 34 (3-4), 409-428 (1979).
19 B. Dam, J. M. Huijbregtse, F. C. Klaassen et al., "Origin of high critical currents in YBa$_2$Cu$_3$O$_{7-delta}$ superconducting thin films," Nature 399 (6735), 439-442 (1999).
20 D. M. Feldmann, O. Ugurlu, B. Maiorov et al., "Influence of growth temperature on critical current and magnetic flux pinning structures in YBa$_2$Cu$_3$O$_{7-x}$," Applied Physics Letters 91 (16) (2007).
21 S Horii, K Yamada, H Kai, A Ichinose, M Mukaida, R Teranishi, R Kita, K Matsumoto, Y Yoshida, J Shimoyama and K Kishio "Introduction of c-axis-correlated 1D pinning centers and vortex Bose glass in Ba—Nb—O-doped ErBa$_2$Cu$_3$O$_y$ films" Supercond. Sci. Technol. 20 (2007) 1115-1119
22 K. Yamada, M. Mukaida, H. Kai, R. Teranishi, A. Ichinose, R. Kita, S. Kato, S. Horii, Y. Yoshida, K. Matsumoto, and S. Toh, "Transmission electron microscopy characterization of nanorods in BaNb$_2$O$_6$-doped ErBa$_2$Cu$_3$O$_{7-\delta}$ films" Appl. Phys. Lett. 92, 112503 (2008)
23 H. P. Rooksby and E. A. D. White, "Rare-earth niobates and tantalates of defect fluorite- and weberite-type structures" J. Amer. Ceram. Soc. Vol 47 Issue 2, p. 94 (1964)

The invention claimed is:

1. A composition including a matrix of a high temperature superconductive oxide, with non-superconductive particles distributed in the matrix, at least some of the particles comprising at least one rare earth element (RE) and at least one of tantalum (Ta) and niobium (Nb).

2. A composition according to claim 1 wherein the rare earth element (RE) is selected from one or more of scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tu), ytterbium (Yb) and lutetium (Lu).

3. A composition according to claim 1, wherein the rare earth element (RE) is selected from one or more of ytterbium (Yb), erbium (Er), gadolinium (Gd) and samarium (Sm).

4. A composition according to claim 1, wherein the rare earth element is provided at a concentration of at least 0.1 atomic percent relative to the total composition.

5. A composition according to claim 1, wherein the Ta and/or Nb within the non-superconductive particles is provided at a concentration of at least 0.01 atomic percent relative to the total composition.

6. A composition according to claim 1, wherein the non-superconductive particles conform to the phase $A_aB_bO_z$, where A is RE and B is Ta or Nb, wherein a is 3 or about 3, b is 1 or about 1 and z is 7 or about 7.

7. A composition according to claim 6 wherein the phase $A_aB_bO_z$ has a crystal structure selected from cubic defect fluorite and orthorhombic weberite.

8. A composition according to claim 1, wherein the high temperature superconductive oxide is a barium copper oxide.

9. A composition according to claim 1, wherein the non-superconductive particles in the superconductive oxide matrix have a preferred crystallographic alignment with the matrix.

10. A composition according to claim 9 wherein at least one crystallographic axis of the non-superconductive particles is aligned parallel to the c-axis of the superconductive oxide matrix.

11. A composition according to claim 10 wherein another crystallographic axis of the non-superconductive particles is aligned at an alignment angle to another crystallographic axis of the matrix.

12. A composition according to claim 1, wherein at least some of the non-superconductive particles have a columnar morphology with a principal axis substantially aligned with the c-axis of the superconductive matrix.

13. A composition according to claim 1, wherein at least some of the non-superconductive particles may be aligned with each other so as to form particle stacks formed of at least two such particles with a principal stacking axis substantially aligned with the c-axis of the superconductive matrix.

14. A composition comprising:
  (i) at least one of Y, Nd, Sm, Eu, Gd, or a mixture thereof, in a combined amount in the range 6-9 atomic percent;
  (ii) Ba in an amount in the range 13-17 atomic percent;
  (iii) Cu in an amount in the range 19-26 atomic percent;
  (iv) at least one rare earth element (RE), or a mixture thereof, additional to (i) but excluding Y, in a combined amount in the range 0.005-4 atomic percent;
  (v) one or both of Ta or Nb in a combined amount in the range 0.001-1 atomic percent;
  (vi) incidental and/or trace impurities; and
  (vii) balance oxygen.

15. An electrical conductor including a layer of the composition according to claim 1.

16. A conductor according to claim 15 wherein the layer is aligned so that the c-axis of at least one crystal grain of the high temperature superconductive oxide is aligned substantially parallel to the thickness direction of the layer.

17. A conductor according to claim 15, wherein the superconductive oxide layer is a substantially epitaxial layer on a substrate or on a buffer layer or buffer layers formed on the substrate.

18. A conductor according to claim 15, wherein the thickness of the layer of superconductive oxide is at least 200 nm.

19. A target for a film deposition process, the target having a composition according to claim 1 or a composition corresponding to the proportion of elements required to form a composition according to claim 14.

20. A method of manufacturing an electrical conductor, including depositing a layer of material on a substrate, the material including a matrix formed of high temperature superconductive oxide or the precursor thereof, the material further including, in addition to that stoichiometrically required to form the high temperature superconductive oxide, at least one rare earth element (RE) and at least one of tantalum (Ta) and niobium (Nb).

21. A method according to claim 20 further including at least one heat treatment, which may be at the same time as the deposition step and/or subsequent thereto, in which heat treatment non-superconductive particles are fanned, distributed in the matrix, said particles including said at least one rare earth element (RE) and at least one of tantalum (Ta) and niobium Nb).

22. An electrical conductor including a layer of the composition according to claim 14, wherein the layer comprises a matrix of a high temperature superconductive oxide.

23. A conductor according to claim 22, wherein the layer is aligned so that the c-axis of at least one crystal grain of the high temperature superconductive oxide is aligned substantially parallel to the thickness direction of the layer.

24. A conductor according to claim 22, wherein the superconductive oxide layer is a substantially epitaxial layer on a substrate or on a buffer layer or buffer layers formed on the substrate.

25. A conductor according to claim 22, wherein the thickness of the layer of superconductive oxide is at least 200 nm.

* * * * *